United States Patent
Kim (10) Patent No.: US 8,057,965 B2
(45) Date of Patent: Nov. 15, 2011

(54) MASK AND METHOD OF FABRICATING THE SAME

(75) Inventor: Hyeong Soo Kim, Yongin-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 146 days.

(21) Appl. No.: 12/343,298

(22) Filed: Dec. 23, 2008

(65) Prior Publication Data

US 2009/0170013 A1    Jul. 2, 2009

(30) Foreign Application Priority Data

Dec. 31, 2007  (KR) .................. 10-2007-0141513

(51) Int. Cl.
*G03F 1/00* (2006.01)
*G03F 7/20* (2006.01)

(52) U.S. Cl. .......................................... 430/5; 430/296
(58) Field of Classification Search ................ 430/5, 30, 430/296, 311–313; 716/19, 21
See application file for complete search history.

(56) References Cited

U.S. PATENT DOCUMENTS

| | | | | | |
|---|---|---|---|---|---|
| 5,439,765 | A | * | 8/1995 | Nozue | 430/5 |
| 5,585,210 | A | * | 12/1996 | Lee et al. | 430/5 |
| 5,725,969 | A | * | 3/1998 | Lee | 430/5 |
| 6,737,199 | B1 | * | 5/2004 | Hsieh | 430/5 |
| 2005/0136340 | A1 | * | 6/2005 | Baselmans et al. | 430/5 |

FOREIGN PATENT DOCUMENTS

| | | |
|---|---|---|
| JP | 2000-047363 | 2/2000 |
| KR | 10-2003-0056357 | 7/2003 |
| KR | 10-2006-0079543 | 7/2006 |

* cited by examiner

*Primary Examiner* — Stephen Rosasco
*Assistant Examiner* — Stewart Fraser
(74) *Attorney, Agent, or Firm* — Marshall, Gerstein & Borun LLP (57) ABSTRACT

The invention relates to a mask and a method of fabricating the same. When a mask pattern is formed using E-Beam, the size of the divisional region obtained by a fracturing process can not be formed equally. Therefore, the uniformity of the mask pattern is degraded. In order to form the divisional region to be of equal sizes, the method includes performing a fracturing process by adding a subsidiary pattern to divide a region except for mask pattern, thereby obtaining a mask pattern having excellent uniformity and reducing defects of semiconductor devices.

5 Claims, 7 Drawing Sheets

MASK AND METHOD OF FABRICATING THE SAME

CROSS-REFERENCE TO RELATED APPLICATION

The priority benefit of Korean patent application number 10-2007-0141513, filed on Dec. 31, 2007, is hereby claimed and the disclosure thereof is incorporated herein by reference in its entirety.

BACKGROUND OF THE INVENTION

The invention relates generally to a method for fabricating a semiconductor device, and more specifically, to a method for performing a fracturing process by adding a subsidiary pattern to divide a region excluding a mask pattern.

In the case of semiconductor devices such as DRAM, a technique is required to add additional transistors in a limited region to improve integration. Accordingly, a vertical transistor as an element included in high integrated memory cells generally having an area of $4F^2$ has been suggested. The vertical transistor provides a surrounding gate structure that surrounds a vertical channel.

In order to form the surrounding gate in an area of $4F^2$, a channel region is selectively, isotropically-etched so that the channel region is formed to be thinner than source/drain regions, thereby obtaining excellent device characteristics. As a result, the vertical transistor can use the limited space more efficiently. The vertical transistor has been highlighted as a transistor for use in various applications such as DRAM where fabricating smaller transistors is optimal.

The vertical transistor is an effective means to improve a short channel effect because a given channel length can be maintained even in a reduced device area. Particularly, the surrounding gate can maximize controllability of the gate, thereby improving the short channel effect and providing excellent operating current characteristics because the current flowing area is broad. As a result, in order to increase the integration, the vertical transistor requires a thinner and longer structure.

In the memory cell having a Critical Dimension (CD) of less than 50 nm, the width of the CD of a pillar of the vertical transistor is narrow, so that it is difficult to fabricate a mask that defines the CD of the pillar.

Figure 1:
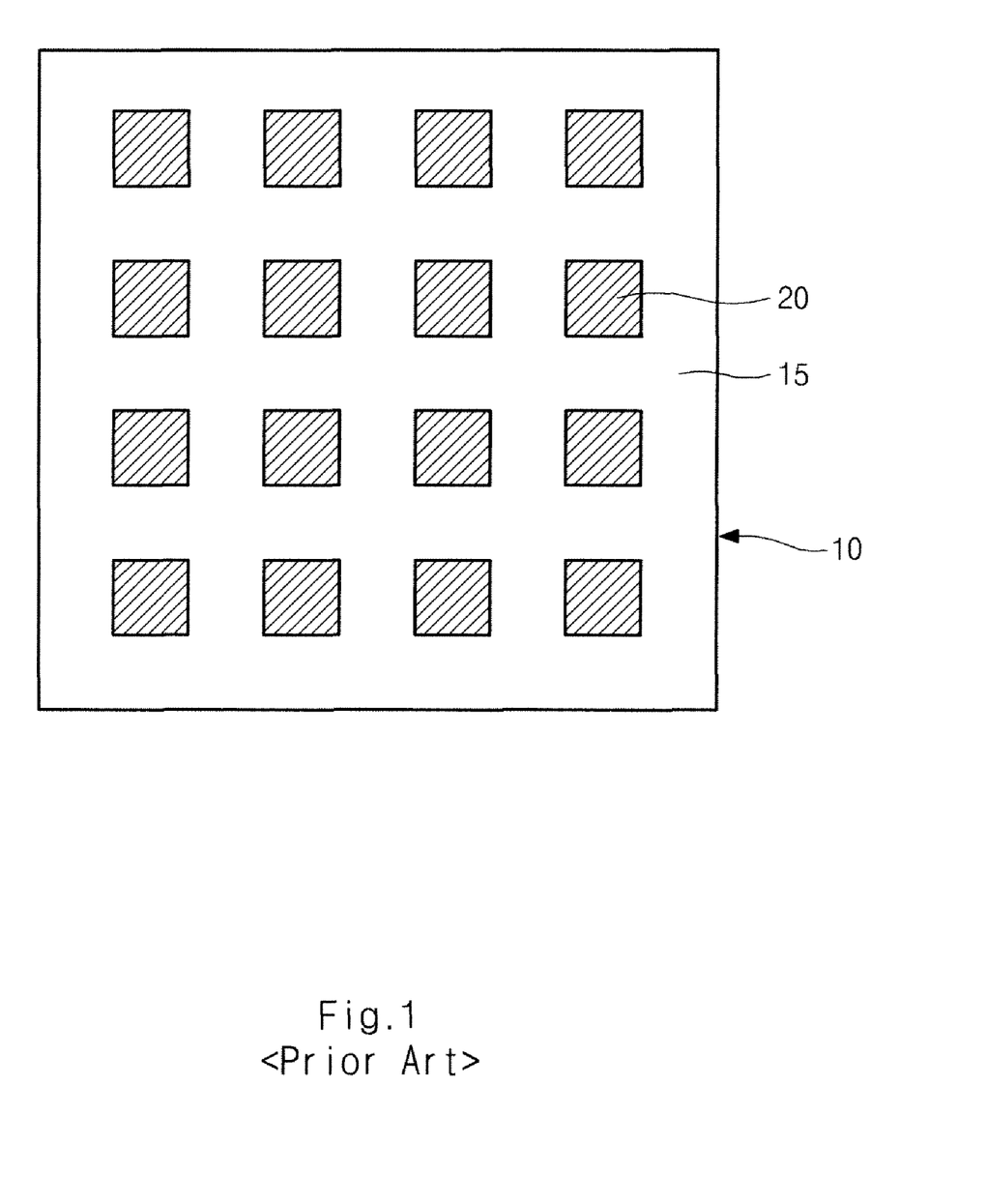
FIG. 1 is a top view illustrating a conventional mask.

FIG. 1 is a top view illustrating a conventional mask.

Referring to FIG. 1, a pillar pattern 20 is formed over a mask 10 including a transparent substrate 15. After forming a chrome layer over the transparent substrate 15, the pillar pattern 20 is obtained by removing a portion of the chrome layer by irradiation with electric beams into a region of the chrome layer excluding the pillar-pattern-expected region. This process is called a fracturing process. However, the CD uniformity of the pillar pattern 20 is remarkably reduced due to high-integration of semiconductor devices.

Figure 2:
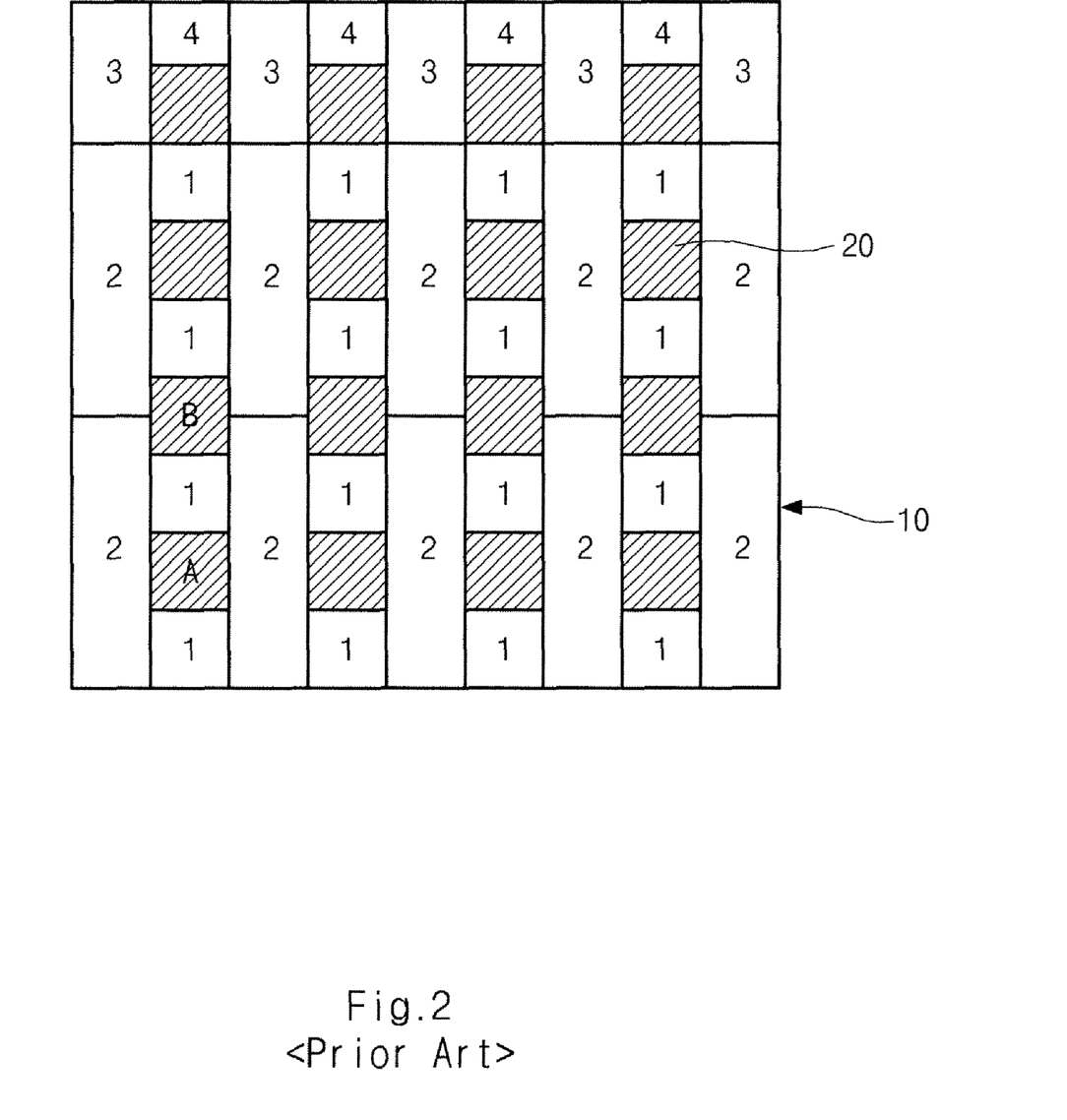
FIG. 2 is a top view illustrating a conventional method of fabricating a mask.

FIG. 2 is a top view illustrating a conventional method of fabricating a mask.

Referring to FIG. 2, divisional regions are numbered in order of the fracturing processes. The divisional region "1", the divisional region "2", the divisional region "3", and the divisional region "4" each have different shapes, which results in each having a different irradiation degree of E-Beam. As a result, the uniformity of the pillar pattern 20 is reduced.

Specifically, E-Beam is irradiated once on the left and right sides of the divisional region "2" of the chrome pattern element A. However, E-Beam is irradiated twice on the left and right sides, respectively, of the divisional region "2" of the chrome pattern element B. As a result, the lithography number is different in the peripheral divisional regions of the chrome pattern element A and the chrome pattern element B.

As a result, the non-uniformity of the pattern is generated by a difference in sizes of the divisional regions.

Figure 3:
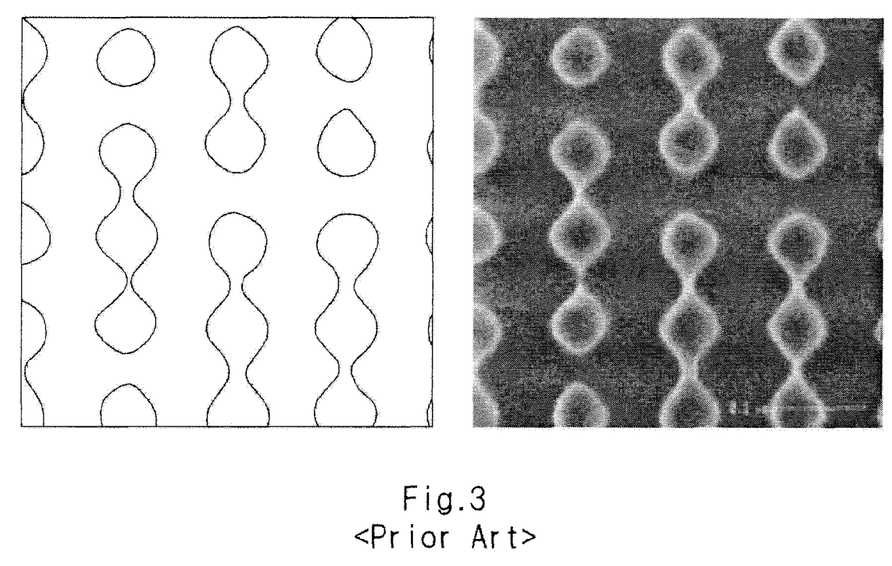
FIGS. 3 and 4 are micrographs illustrating defects of a semiconductor device formed using a conventional mask.
Figure 4:
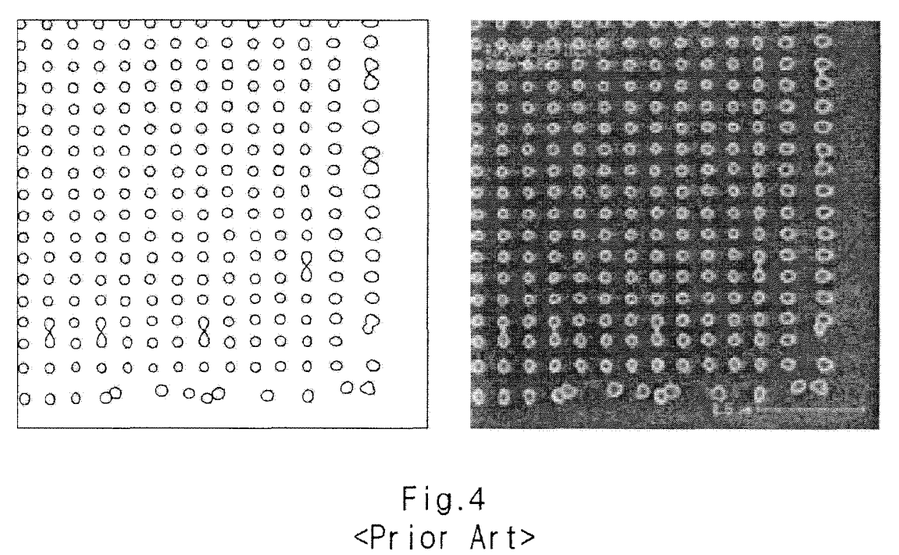

FIGS. 3 and 4 are micrographs illustrating defects of a semiconductor device formed using a conventional mask.

Referring to FIGS. 3 and 4, a photoresist pattern formed using a mask having reduced uniformity as shown in FIG. 2 shows multiple occurrences of a defect, that is, a bridge phenomenon between the photoresist patterns.

Figure 5:
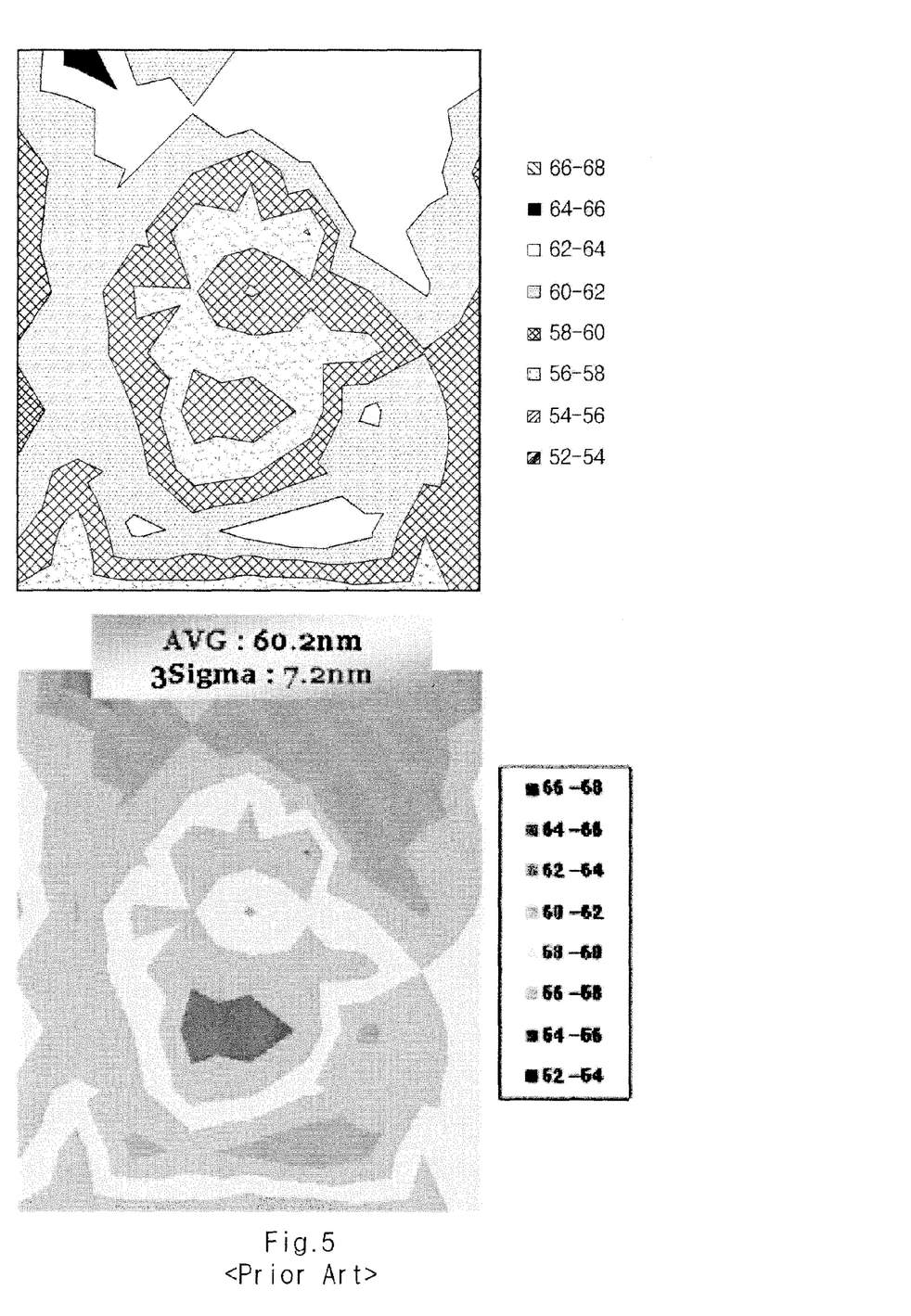
FIG. 5 is a simulation diagram illustrating the CD non-uniformity of the semiconductor device formed using the conventional mask.

FIG. 5 is a simulation diagram illustrating the CD non-uniformity of the semiconductor device formed using the conventional mask.

Referring to FIG. 5, the diagram shows that the color is differentiated in each CD of the pillar pattern formed over the mask. A CD of the pillar pattern is changed depending on the exposed region.

Figure 6:
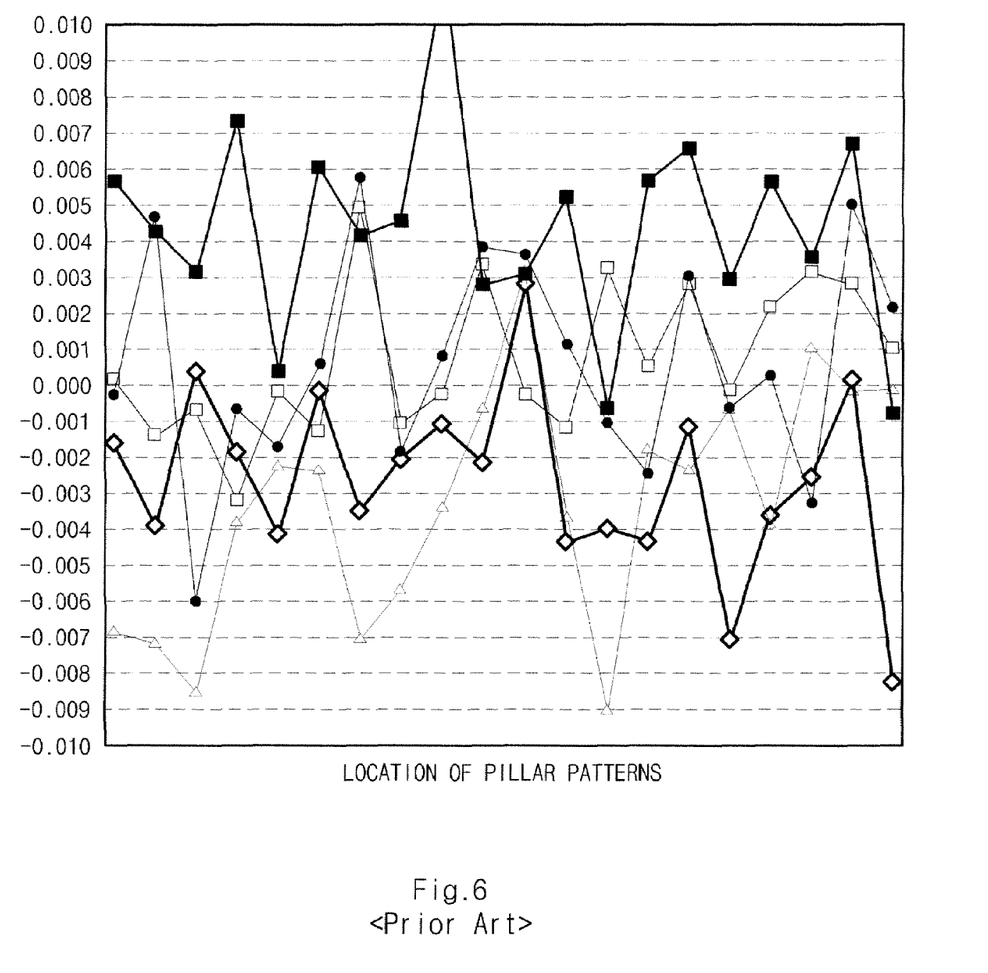
FIG. 6 is a graph illustrating CD non-uniformity of a conventional mask.

FIG. 6 is a graph illustrating CD non-uniformity of a conventional mask.

Referring to FIG. 6, the graph shows the simulation results of FIG. 5 and compares the change in the CD of the pillar pattern 20 depending on locations of the pillar pattern 20 formed over the mask.

As mentioned above, when the divisional regions of the fracturing process are defined differently in formation of a mask for manufacturing a semiconductor device, the uniformity of the mask pattern that defines the semiconductor device is reduced. As a result, when a semiconductor device is manufactured with a mask having non-uniformity, defective patterns are generated, thereby degrading yield and reliability of the semiconductor device.

SUMMARY OF THE INVENTION

The invention relates to a mask and a method of fabricating the same. When a mask pattern is formed using E-Beam, the size of the divisional region obtained by the fracturing process may not be formed equally. Therefore, the uniformity of the mask pattern is degraded. In order to form the divisional region to be of equal sizes, the method includes performing the fracturing process by adding a subsidiary pattern to divide a region excluding the mask pattern, thereby obtaining a mask pattern having excellent uniformity and reducing defects of semiconductor devices.

According to an embodiment of the invention, a method of fabricating a mask includes: forming a mask layer on a base layer; patterning the mask layer to form a mask pattern and a subsidiary pattern by irradiating the mask layer with an electric beam to remove a region of the mask layer surrounding each element of the mask pattern; and removing the subsidiary pattern.

Preferably, the removed region includes two divisional regions, each having a rectangular shape.

Preferably, one divisional region is defined as an area between adjacent elements of the mask in the X-axis direction and between adjacent elements of the subsidiary pattern in the Y-axis direction, and the other divisional region is defined as an area between adjacent elements of the subsidiary pattern in the X-axis direction and between adjacent elements of the mask pattern in the Y-axis direction.

Preferably, the mask layer is made from Chrome.

Preferably, the base layer is a transparent substrate.

Preferably, a critical dimension of the subsidiary pattern is 1 nm or more, and the size of the subsidiary pattern is less than ½ the minimum CD.

Preferably, the mask pattern defines pillar locations for vertical transistors.

According to another embodiment of the invention, a method of fabricating a mask includes: forming a mask layer on a base layer; patterning the mask layer to form a mask pattern and a subsidiary pattern by irradiating the mask layer with an electric beam to remove a region of the mask layer surrounding each element of the mask pattern, wherein each region is irradiated the same number of times; and removing the subsidiary pattern.

According to an embodiment of the invention, a mask is fabricated by the above-described method of fabricating a mask.

According to another embodiment of the invention, a mask includes a pattern mask layer on a base layer, the patterned mask layer having primary mask pattern elements and subsidiary mask pattern elements disposed centered between four primary mask pattern elements.

DETAILED DESCRIPTION OF SPECIFIC EMBODIMENT

The invention will be described in detail with reference to the drawings.

According to an embodiment of the invention, a method of fabricating a mask 100 can improve CD uniformity of a mask pattern 120 by controlling the fracturing process performed to form the mask pattern 120. The mask pattern 120 can be, for example, a chrome pattern.

Figure 7:
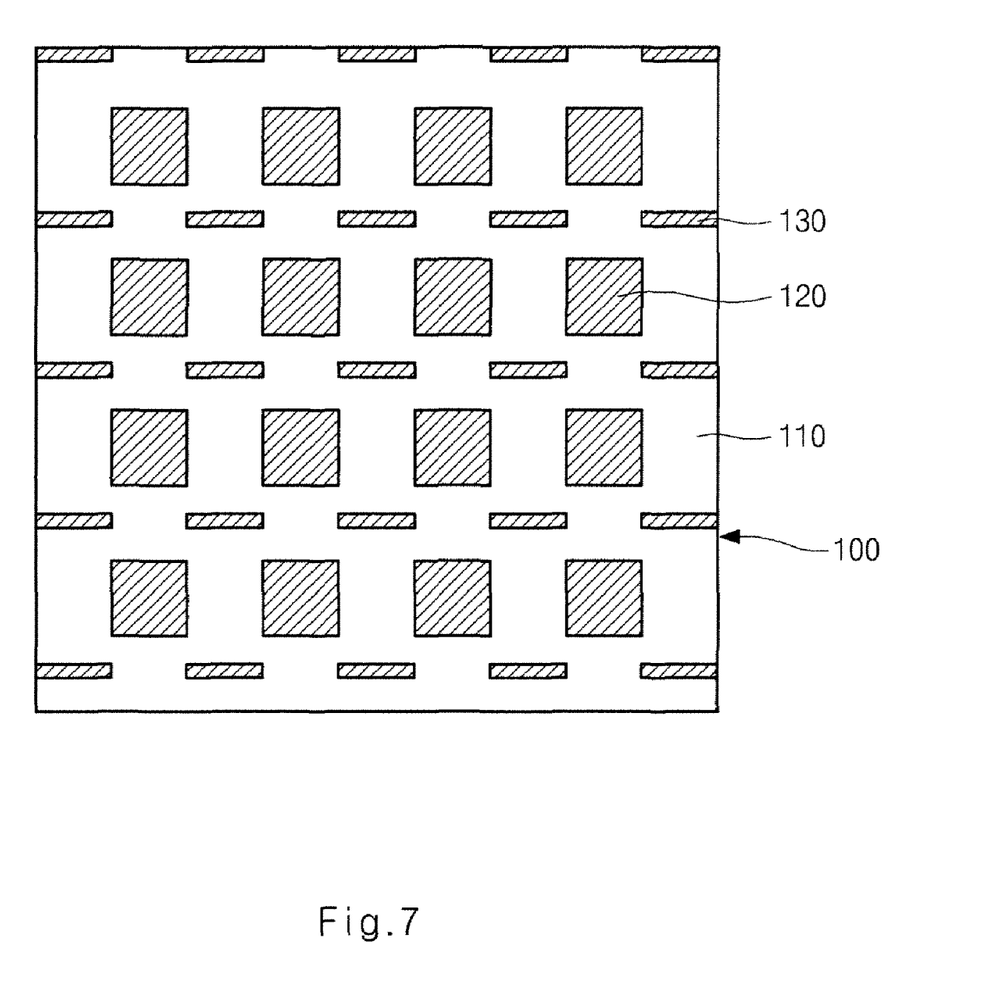
FIG. 7 is a top view illustrating a mask according to an embodiment of the invention.

FIG. 7 is a top view illustrating a mask 100 according to an embodiment of the invention.

Referring to FIG. 7, a mask-pattern-expected-region (not shown) that defines locations of pillars of vertical transistors is formed over a base layer 110, which is the body of a mask 100. The base layer 110 can be, for example, a transparent substrate.

Subsidiary pattern elements 130 are formed in the center of four of the mask-pattern-expected-regions. A critical dimension (CD) of the subsidiary pattern 130 is less than ½ of the minimum CD of the mask pattern. The minimum CD of the mask pattern can be, for example, 1 nm or more.

When the subsidiary pattern 130 is formed between the mask-pattern-expected regions, the size of the divisional regions can be formed to be substantially identical with each other so as to improve the uniformity of the mask-pattern-expected regions.

Figure 8:
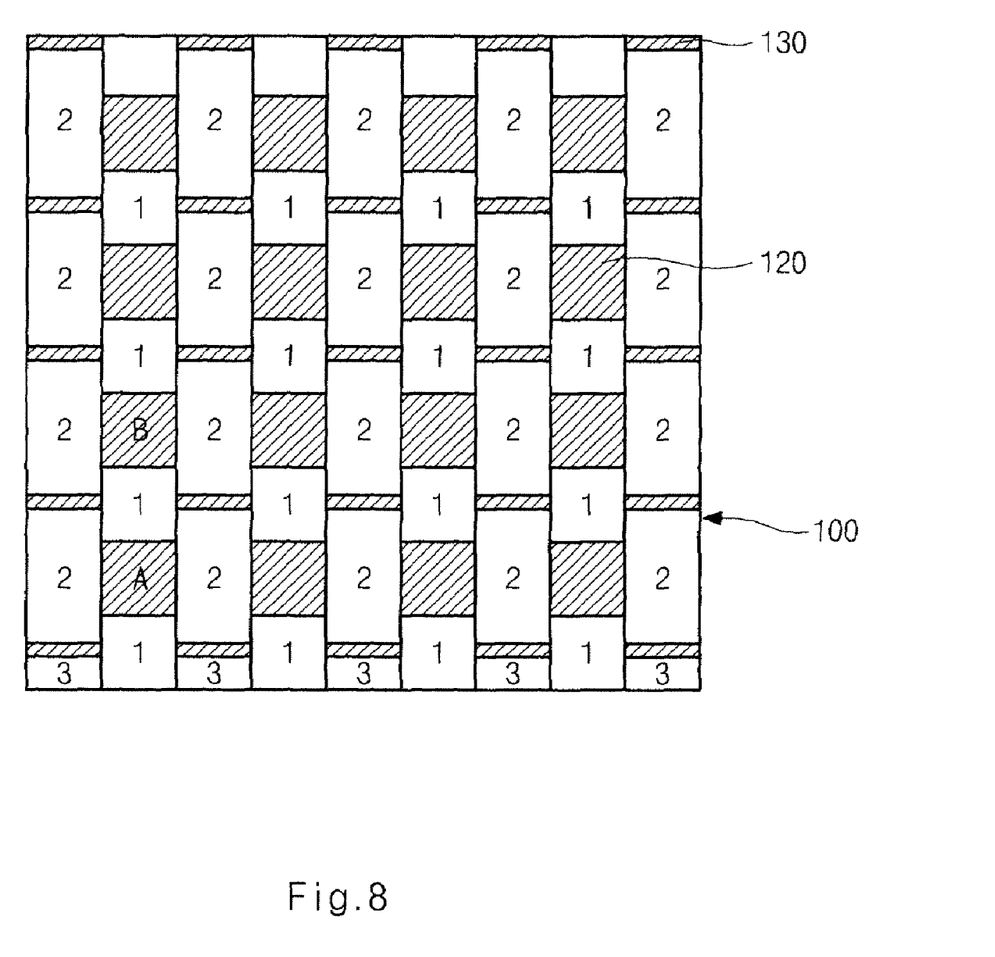
FIG. 8 is a top view illustrating a method of fabricating a mask according to an embodiment of the invention.

FIG. 8 is a top view illustrating a method of fabricating a mask 100 according to an embodiment of the invention.

Referring to FIGS. 7 and 8, the mask-pattern-expected region for performing a fracturing process is defined over the base layer 110, to form a mask pattern 120 of the mask 100. The mask pattern 120 is formed through a fracturing process.

After a mask layer (not shown) is formed over the base layer 110, the mask layer is patterned to form the mask pattern 120 and the subsidiary pattern 130. The mask layer can be patterned, for example, by irradiating divisional regions of the mask layer with E-Beam to remove the divisional regions. As shown in FIG. 8, the E-Beam can be sequentially irradiated into the divisional region "1" and the divisional region "2" to remove the divisional regions. Divisional region "1" is defined as the area between adjacent mask pattern 120 elements in the Y-axis direction and between adjacent subsidiary pattern 130 elements in the X-axis direction. Divisional region "2" is defined as the area between adjacent subsidiary pattern 130 elements in the Y-axis direction and adjacent mask pattern 120 elements in the X-axis direction. The subsidiary pattern 130 is defined so that the shapes of the divisional regions "1" can be formed to be the same and the shapes of the divisional regions "2" can be formed to be the same. In this embodiment, the subsidiary pattern 130 can be removed after removal of the divisional regions.

Specifically, E-Beam is irradiated once into the left and right sides of the divisional region "2" of elements A and B of the mask pattern 120. As a result, the number of times of lithography in the peripheral divisional region of the mask pattern 120 element A and element B is the same, thereby preventing non-uniformity of the patterns generated by the size difference of the divisional regions.

As described above, when a mask that defines a semiconductor device is fabricated, a mask pattern 120 is patterned on the mask using E-Beam. When the size of divisional regions is not uniform while the fracturing process is performed on a region excluding the mask pattern 120, the uniformity of the mask pattern 120 is degraded. In order to maintain the size of the divisional regions to be uniform, a subsidiary pattern 130 is added to equally divide the region equally excluding the mask pattern 120. As a result, a mask pattern 120 having excellent uniformity can be obtained, and a semiconductor device can be manufactured using the mask 100, thereby preventing generation of defects and improving yield and reliability of the semiconductor device.

The above embodiments of the invention are illustrative and not limitative. Various alternatives and equivalents are possible. Throughout the specification, where methods and compositions are described as including steps or materials, it is contemplated that the methods and compositions can also consist essentially of, or consist of, any combination of the recited steps or materials, unless described otherwise. The invention is not limited by the type of deposition, etching polishing, and patterning steps described herein. Nor is the invention limited to any specific type of semiconductor device. For example, the invention can be implemented in a dynamic random access memory (DRAM) device or non-volatile memory device. Other additions, subtractions, or modifications are obvious in view of the present disclosure and are intended to fall within the scope of the appended claims.

What is claimed is:

1. A method of fabricating a mask, the method comprising:
    forming a mask layer on a base layer;
    patterning the mask layer to form a mask pattern and a subsidiary pattern by irradiating the mask layer with an electric beam onto two divisional regions of the mask layer surrounding the mask pattern, each divisional region having a rectangular shape, wherein the one divisional region is defined as an area between adjacent elements of the mask pattern in an X-axis direction and between adjacent elements of the subsidiary pattern in a Y-axis direction, and the other divisional region is defined as an area between adjacent elements of the subsidiary pattern in the X-axis direction and an area between adjacent elements of the mask pattern in the Y-axis direction, and wherein the regions are irradiated the same number of times; and removing the subsidiary pattern.

2. The method according to claim 1, comprising forming the mask layer from Chrome.

3. The method according to claim 1, wherein the base layer is a transparent substrate.

4. The method according to claim 1, comprising patterning the mask layer to form a subsidiary pattern having a critical dimension of about 1 nm or more, and the critical dimension of the subsidiary pattern is less than ½ of the minimum critical dimension of the mask pattern.

5. The method according to claim 1, wherein the mask pattern defines pillar locations of vertical transistors.

* * * * *